United States Patent
Sato

(10) Patent No.: US 7,257,753 B2
(45) Date of Patent: Aug. 14, 2007

(54) SEMICONDUCTOR TESTING APPARATUS

(75) Inventor: Kazuhiko Sato, Tokyo (JP)

(73) Assignee: Advantest Corporation, Tokyo (JP)

( * ) Notice: Subject to any disclaimer, the term of this patent is extended or adjusted under 35 U.S.C. 154(b) by 285 days.

(21) Appl. No.: 10/495,717

(22) PCT Filed: Nov. 14, 2002

(86) PCT No.: PCT/JP02/11877

§ 371 (c)(1),
(2), (4) Date: Oct. 29, 2004

(87) PCT Pub. No.: WO03/052767

PCT Pub. Date: Jun. 26, 2003

(65) Prior Publication Data

US 2005/0073332 A1    Apr. 7, 2005

(30) Foreign Application Priority Data

Nov. 15, 2001  (JP) .............................. 2001-349950

(51) Int. Cl.
*G01R 31/28* (2006.01)
(52) U.S. Cl. .................................................. 714/738
(58) Field of Classification Search ................ 714/718, 714/724, 738; 324/765
See application file for complete search history.

(56) References Cited

U.S. PATENT DOCUMENTS 5,964,894 A * 10/1999 Kurihara ..................... 714/738
7,107,504 B2 * 9/2006 Sato et al. ................... 714/733
2003/0204797 A1 * 10/2003 Lin ............................. 714/718

FOREIGN PATENT DOCUMENTS

| JP | 5-157802    | 6/1993  |
|----|-------------|---------|
| JP | 8-82659     | 3/1999  |
| JP | 11-316259   | 11/1999 |
| JP | 2000-100196 | 4/2000  |
| JP | 2000-276367 | 10/2000 |
| JP | 2000-331495 | 11/2000 |
| JP | 2002-15596  | 1/2002  |
| JP | 2002-50193  | 2/2002  |
| JP | 2002-74984  | 3/2002  |
| JP | 2002-83499  | 3/2002  |

* cited by examiner

*Primary Examiner*—James C Kerveros
(74) *Attorney, Agent, or Firm*—Patenttm.us; James H. Walters

(57) ABSTRACT

A semiconductor testing apparatus capable of reducing time required for testing or repairing a plurality of semiconductor devices. The semiconductor testing apparatus performs test for a plurality of DUT in parallel and performs repair for the plurality of DUT in parallel. For this, the apparatus includes an ALPG, a PDS, an AFM, a driver pin processor, an IO pin processor, a driver channel, and an IO channel. The IO pin processor has a plurality of sub-FC units. When test is performed simultaneously for a plurality of DUT, an individual pattern waveform is generated corresponding to individual information.

5 Claims, 4 Drawing Sheets

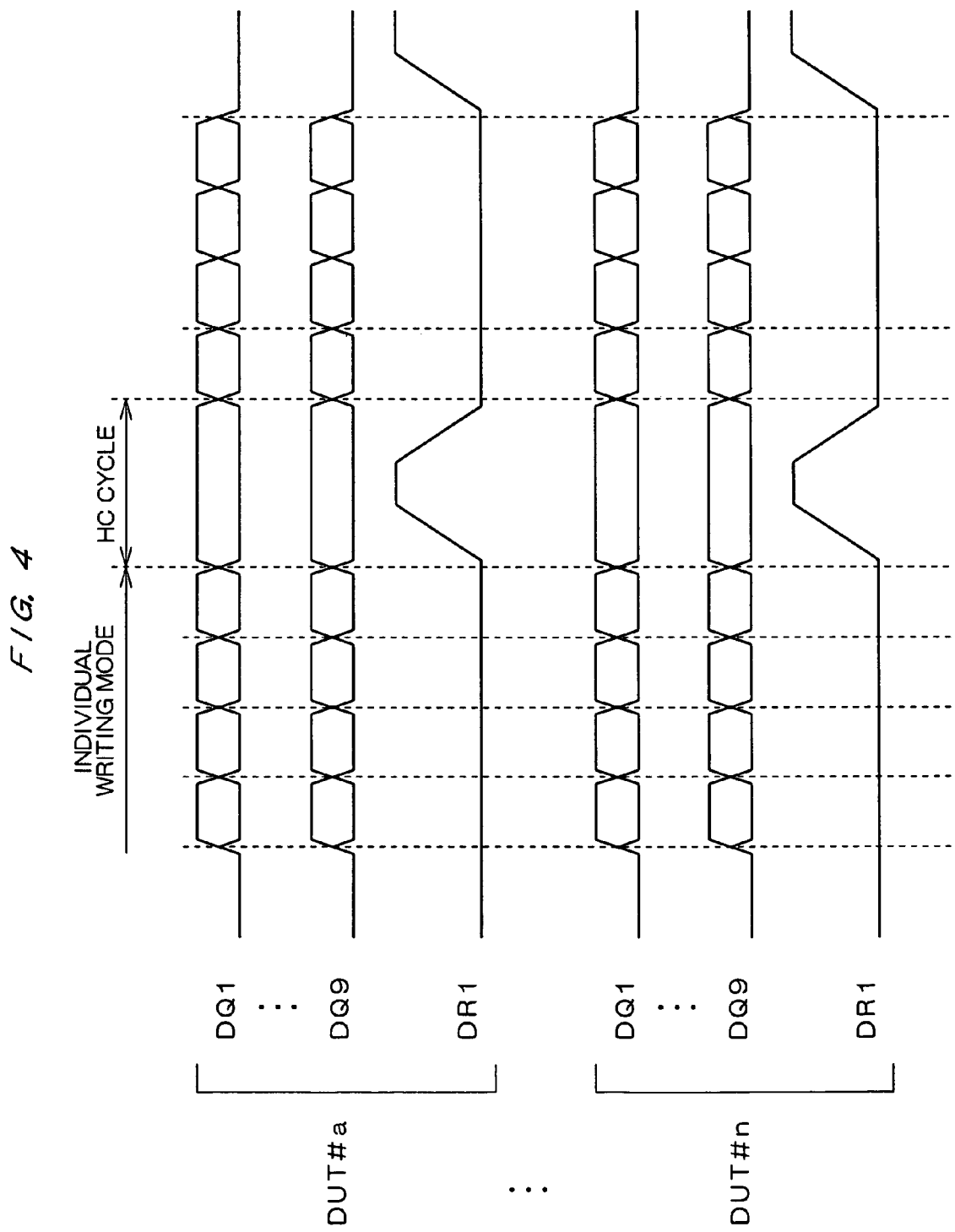

SEMICONDUCTOR TESTING APPARATUS

TECHNICAL FIELD

The present invention relates to a semiconductor testing apparatus for simultaneously testing a plurality of semiconductor devices.

BACKGROUND ART

Conventionally, as an apparatus for applying various tests to a semiconductor device such as a logic IC or a semiconductor memory before shipping, there has been known a semiconductor testing apparatus. For example, a general semiconductor apparatus for testing a semiconductor memory has a multiple simultaneous measuring function and is adapted to be able to input an identical test data pattern waveform to the pins of same pin number of a plurality of semiconductor devices to test the semiconductor devices. By including this multiple simultaneous measuring function, since it becomes possible to perform measurement for a large number of semiconductor memories with limited amount of resources, an apparatus size is not extremely increased, and reduction in costs becomes possible.

However, recently, a semiconductor device such as a flash memory, which gives different ID information (individual information) for each device to perform identification of information, has appeared on the market. In the case in which such a semiconductor device is tested, since it is necessary to input individual information (individual pattern) for each semiconductor device, a plurality of semiconductor devices cannot be tested simultaneously using the above-described multiple simultaneous measuring function. Therefore, there is a problem in that, even in the case in which a test is performed using the semiconductor testing apparatus having the multiple simultaneous measuring function, it is necessary to generate independent individual information (individual pattern waveform) and inputs the independent individual information for each of a plurality of semiconductor devices which have been set, time required for the test is long.

In addition, a part of semiconductor memories (e.g., a part of dynamic RAMs) includes an auxiliary cell for repairing a defective cell detected by a test and performs a repair operation for switching from this defective cell to the auxiliary cell with application of a high-voltage waveform. There is a problem in that, in applying this high-voltage waveform, since it is necessary to input an address or the like, which specifies a repair line for switching the defective cell and the auxiliary cell, as individual information, a repair operation for the defective cell cannot be performed for a plurality of semiconductor memories simultaneously in the same manner as the above-described case in which a flash memory or the like is tested, and the repair operation takes time. In addition, conventionally, such a repair operation is performed using a dedicated repair apparatus. Since work for transferring a semiconductor memory, in which a defective cell is detected, from the semiconductor testing apparatus to the repair apparatus is required, the time required for the repair operation becomes longer.

DISCLOSURE OF THE INVENTION

The present invention has been devised in view of such points, and it is an object of the present invention to provide a semiconductor testing apparatus which can reduce time for testing and repairing a plurality of semiconductor devices.

The semiconductor testing apparatus of the present invention includes: a first waveform generation unit which generates a common pattern waveform corresponding to common information which is common to each of a plurality of semiconductor devices; a plurality of second waveform generation units which generate individual pattern waveforms corresponding to plural pieces of individual information which are prepared individually in association with each of the plurality of semiconductor devices; a waveform switching unit which selectively applies an operation for commonly inputting the common pattern generated by the first waveform generation unit and an operation for individually inputting the individual pattern waveforms generated by each of the plurality of second waveform generation units to each of the plurality of semiconductor devices. Consequently, since operations for generating plural pieces of individual information different from each other and inputting the individual information can be applied in parallel to each of the plurality of semiconductor devices. Thus, time required for a test in the case in which input of different pieces of individual information is necessary can be reduced.

In addition, it is desirable to further include: a pass/fail judgment unit which performs pass/fail judgment of a test object portion in the semiconductor devices on the basis of an output waveform which is outputted from the semiconductor devices in association with the above-described common pattern waveform or individual pattern waveforms; and a fail memory which stores a result of the judgment by the pass/fail judgment unit. Consequently, it becomes possible to perform the pass/fail judgment for respective portions of the semiconductor device while switching the common pattern waveform and the individual pattern waveforms at any given timing for the semiconductor devices.

Further, it is desirable that the above-described fail memory has a first storage area for storing a result of the judgment by the pass/fail judgment unit and a second storage area for storing individual information and reads out the individual information stored in the second storage area to generate the individual pattern waveforms with the above-described second waveform generation unit. By storing the individual information in the fail memory, since wiring for a data bus used for connecting the fail memory can be used for reading out the individual information, simplification of the wiring becomes possible.

Moreover, it is desirable that, in the case in which a memory, which is provided in a same package as the second waveform generation unit and stores the individual information, is further provided, the second waveform generation unit reads out the individual information stored in the memory to generate the individual pattern waveforms. In the case in which the memory provided in the same package is used, since wiring drawn around in the outside of the package becomes unnecessary, simplification of the wiring becomes possible. In addition, since unnecessary wiring is eliminated, gap or the like of timing is less likely to occur, and reading-out of the individual information can be performed at high speed.

It is desirable to further include a drive unit which is provided in a later stage of the first waveform generation unit or the second waveform generation unit, inputted with the common pattern waveform or the individual pattern waveforms, and selectively performs a drive operation for a signal level to be inputted at the time of a normal operation of the semiconductor devices and a drive operation for a high-voltage large current for cutting a fuse provided in the semiconductor devices. Consequently, it becomes possible to electrically cut the fuse provided in the semiconductor devices. For example, a repair operation for switching a repair line using this fuse to switch a defective cell in the semiconductor devices to a normal cell becomes possible.

BRIEF DESCRIPTION OF THE DRAWINGS

FIG. 4 is a timing chart showing a specific example of a repair operation.

BEST MODE FOR CARRYING OUT THE INVENTION

A semiconductor testing apparatus to which the present invention is applied will be hereinafter described with reference to the drawings.

Figure 1:
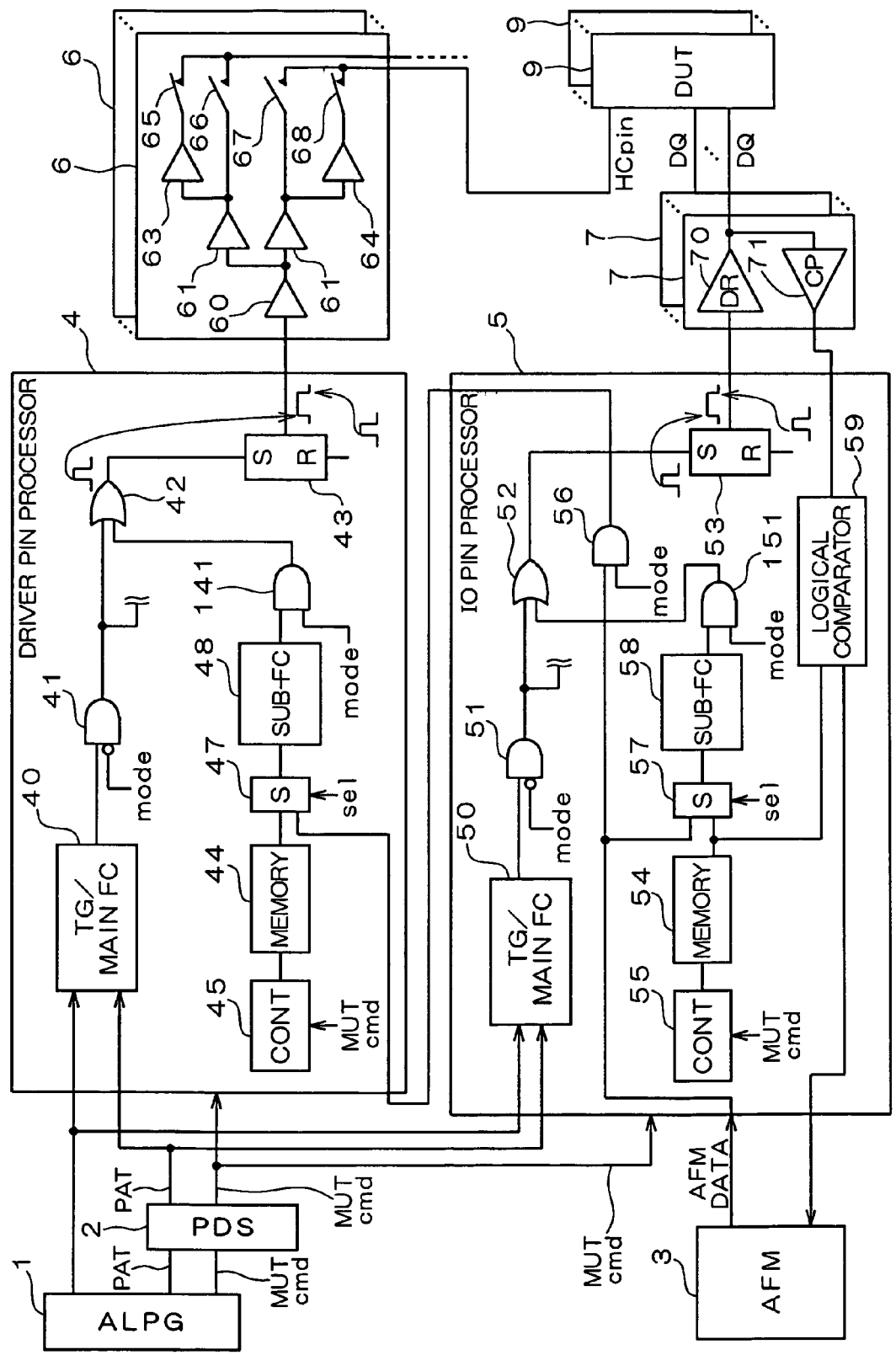
FIG. 1 is a diagram showing a structure of a semiconductor testing apparatus of an embodiment.

FIG. 1 is a diagram showing a structure of a semiconductor testing apparatus of this embodiment. The semiconductor testing apparatus shown in FIG. 1 performs a test for a plurality of DUTs (Devices Under Test) 9 in parallel and performs a repair operation for the plurality of DUTs 9 in parallel. For this purpose, the semiconductor testing apparatus of this embodiment includes an ALPG (algorithmic pattern generator) 1, a PDS (pattern data selector) 2, an AFM (address fail memory) 3, a driver pin processor 4, an IO pin processor 5, driver channels 6, and IO channels 7. Note that the DUTs 9 include a wide variety of semiconductor devices such as a semiconductor memory and a logic IC. However, in the following description, the semiconductor memory is mainly an object to be tested.

The ALPG 1 generates a pattern data (PAT) to be inputted to driver pins and IO pins of the DUTs 9 in order to perform a test and a repair operation. The PDS 2 associates various pattern data to be outputted from the ALPG 1 and respective pins of the DUTs 9 to which these data are inputted. The AFM 3 stores fail information, which has been obtained by a test for the DUTs 9, by a unit of a cell of the DUTs 9. More specifically, a result of testing the pass and fail of a memory cell corresponding to a logical address X or Y of the DUTs 9 is stored in an area specified by the address X or Y of the AFM 3.

In order to generate data to be inputted to the driver pins of the DUTs 9, the driver pin processor 4 includes a TG/main FC (timing generation/main format control) section 40, a memory 44, a selector (S) 47, and a sub FC (format control) section 48. Here, the "driver pin" is a pin for performing only input of a pattern waveform such as an address pin or various control pins.

The TG/main FC section 40 generates actual data (common pattern waveform), which is inputted to the DUTs 9, on the basis of a function as a timing generator, which generates various timing edges included in a basic period of a test operation, the timing edges, and pattern data to be outputted from the PDS 2. This data is inputted to one input terminal of an AND circuit 41 provided in a later stage. An individual writing mode signal (mode) is invertedly inputted to the other input terminal of the AND circuit 41. The "individual writing mode" is an operation mode for writing individual information in parallel to each of the plurality of DUTs 9 which are objects of simultaneous measurement. Designation of the individual writing mode is performed by, for example, setting this individual writing mode signal to a high level with the above-described ALPG 1. Since this high-level individual writing mode signal is invertedly inputted to the other input terminal of the AND circuit 41, output data of the TG/main FC section 40 is cut off by the AND circuit 41, after all, when the individual writing mode is designated. Note that this mode signal is a signal controllable by the ALPG 1. By using this mode signal, it becomes possible to switch a common pattern waveform and individual writing pattern waveform on a real time basis.

The memory 44 stores any given pattern data. For example, the driver pin processor 4 is constituted by an ASIC (Application Specific Integrated Circuit). Reading-out of pattern data from this memory 44 is performed by the control of the address pointer controller (CONT) 45. The selector 47 selects data to be inputted from the memory 44 or data to be inputted from the IO pin processor 5 and inputs the data to the sub FC section 48. Contents of data to be outputted from the IO pin processor 5 and inputted to the selector 47 will be described later.

The sub FC section 48 generates actual data (individual pattern waveforms), which is inputted to the respective DUTs 9 in the individual writing mode, on the basis of the data to be inputted from the selector 47. Output data of the sub FC section 48 is inputted to the other end of an AND circuit 141, to one end of which the individual writing mode signal (mode) is inputted, and is inputted to an OR circuit 42 in a later stage when the individual writing mode signal is high level. Note that, compared with the number of pieces of waveform information retained in the TG/main FC section 40, the number of pieces of waveform information (only waveform information necessary for the multiple simultaneous measuring function is included) retained in the sub FC section 48 is set small. Consequently, the sub FC section 48 can use a simple waveform formatter in which only minimum waveform information required for the individual writing mode is retained. In addition, it is assumed that a function of a timing generator included in the TG/main FC section 40 is individually provided in each sub FC section 48.

The OR circuit 42 outputs data, which has been generated by the TG/main FC section 40 and inputted via the AND circuit 41, or data, which has been generated by the sub FC section 48 and inputted via the AND circuit 141. The output data of this OR circuit 42 is outputted toward the drive channel 6 through a flip-flop 43 for generating a data pattern to be applied to the driver channel 6.

Note that, in the internal structure of the above-described driver pin processor 4, the TG/main FC section 40 and the AND circuit 41 are provided in common with respect to the plurality of DUTs 9, and the sub FC section 48, the memory 44, and the like other than the TG/main FC section 40 and the AND circuit 41 are provided individually in association with each of the plurality of DUTs 9, respectively. In addition, the driver pin processor 4 is provided for each of the plurality of driver pins of the respective DUTs 9.

In order to generate data to be inputted to the IO pins of the DUTs 9 and perform the pass/fail judgment of data to be outputted from these IO pins, the IO pin processor 5 includes a TG/main FC section 50, a memory 54, a selector (S) 57, a sub FC section 58, and a logical comparator 59. Here, the "IO pins" are pins for inputting and outputting a pattern waveform such as a data pin.

The logical comparator 59 compares data to be outputted from the IO pins of the DUTs 9 and predetermined expected value data, and renders pass judgment in the case of agreement and fail judgment in the case of disagreement. A result of this judgment is stored in the AFM 3. Note that components other than the logical comparator 59 are the same as the components included in the drive pin processor 4. Thus, detailed descriptions of the components will be omitted. In addition, as an internal structure of the IO pin processor 5, the TG/main FC section 50 and the AND circuit 51 are commonly provided with respect to the plurality of DUTs 9. The sub FC section 58, the memory 54, the logical comparator 59, and the like other than the TF/main FC unit 50 and the AND circuit 51 are provided individually in association with the plurality of DUTs 9, respectively. In addition, the IO pin processor 5 is provided individually in association with each of the plurality of IO pins of the respective DUTs 9.

The driver channel 6 generates an actual pattern waveform to be inputted to the driver pins of the DUTs 9. Pattern waveforms to be generated by the driver channel 6 include two kinds of waveforms, namely, a waveform of a normal voltage level which is used for performing a test for the DUTs 9 (this waveform will be hereinafter referred to as "normal waveform") and a waveform of a high voltage and a large current which cuts a fuse in order to switch a memory cell in a repair operation (this waveform will be hereinafter referred to as "high-voltage waveform"). In order to generate these two kinds of waveforms, the drive channel 6 include a driver 60, a two-branch driver 61, HC (high current) drivers 63 and 64, and switches 65 to 68. By turning ON the switches 66 and 67 and turning OFF the switches 65 and 68, a normal waveform, which is generated by combining the driver 60 and the two-branch driver 61, is outputted. Conversely, by turning OFF the switches 66 and 67 and turning ON the switches 65 and 68, a high-voltage waveform, which is generated by further combining the HC drivers 63 and 64 with the above-described combination, is outputted.

The IO channel 7 generates an actual pattern waveform to be applied to the IO pins of the DUTs 9 and converts a waveform, which is actually outputted from the IO pins, into logical data. For this purpose, the IO channel 7 includes a driver (DR) 70 and a comparator (CP) 71. The driver 70 generates a normal waveform on the basis of data inputted to the flip-flop 53 in the corresponding IO pin processor 5. The comparator 71 compares a voltage of a waveform appearing in the IO pins (DQs) of the DUTs 9 and a predetermined reference voltage to thereby determine a value of logical data.

The TG/main FC units 40 and 50, the sub FC units 48 and 58, and the AND circuits 41, 51, 141 and 151 and the OR circuits 42 and 52 correspond to the first waveform generation unit, the second waveform generation unit, and the waveform switching unit, respectively. The logical comparator 59, the AFM 3, and the driver channel 6 correspond to the pass/fail judgment unit, the fail memory, and the drive unit, respectively.

The semiconductor test apparatus of this embodiment has such a structure as described above. A test operation and a repair operation with respect to the DUTs 9 will be described.

(1) Test Operation (1-1) Case in Which Same Data is Written to the Plurality of DUTs 9

Pattern data outputted from the ALPG 1 is allocated to the IO pin processor 5 or the drive pin processor 4, which corresponds to the IO pins or the driver pins to which this pattern data is inputted, by the DPS 2. Note that, since operations for generating data to be inputted to the IO pins and the driver pins are basically the same, in the following description, the operation will be described using the case of the IO pin processor 5.

In the IO pin processor 5, the TG/main FC section 50 creates test data matched with actual input timing on the basis of the inputted pattern data. In this case, since an individual writing mode signal maintains a low level, output data of the TG/main FC section 50, which has been inputted to one input terminal, is directly outputted from the AND circuit 51. An output terminal of this AND circuit 51 is branched and connected to one input terminal of the OR circuit 52 which is provided in association with each of the plurality of DUTs 9. Therefore, common data outputted from the TG/main FC section 50 is simultaneously inputted to a plurality of OR circuits 52 and inputted to the flip-flop 53.

In the IO channel 7, the driver 70 generates a normal waveform on the basis of the data inputted to the flip-flop 53 in the IO pin processor 5. This normal waveform is inputted to corresponding IO pins (DQs).

In addition, in the driver channel 6, the switches 66 and 67 are set to an ON state in order to generate a normal waveform, and a normal waveform is generated on the basis of the data inputted to the flip-flop 43 in the driver pin processor 4. This normal waveform is inputted to corresponding driver pins.

After the normal waveforms generated by the IO pin processor 5 and the IO channel 7 are inputted to the IO pins, and the normal waveforms generated by the driver pin processor 4 and the driver channel 6 are inputted to the driver pins in this way, a waveform corresponding to these normal waveforms is outputted from any one of the IO pins. In the IO channel 7 corresponding to this IO pin, the comparator 71 compares a voltage of the waveform outputted from this IO pin and a predetermined reference voltage to generate logical data. Moreover, in the IO driver processor 5 corresponding to this IO pin, the logical comparator 59 performs pass/fail judgment using the data inputted from the comparator 71 in the IO channel 7. A result of this judgment is stored in the AFM 3 or the memory 54.

(1-2) Case in Which Individual Information is Written in each of the Plurality of DUTs 9 (No. 1)

When an individual writing mode pattern synchronizing with the operation of the ALPG 1 is generated by the ALPG 1, and a high-level individual writing mode signal is outputted, in the AND circuits 51 and 41, output data of the TG/main FC units 50 and 40 are masked, and an individual writing operation using an individual pattern stored in the AFM 3 instead of the output data is started.

In the individual writing operation using the AFM 3, pattern data corresponding to the respective IO pins of the respective DUTs 9, which is stored in the AFM 3, is read out and inputted to the sub FC section 58 via the selector 57. The sub FC section 58 creates test data corresponding to individual information for each of the DUTs 9 matched with actual input timing on the basis of the inputted pattern data. This test data is inputted to the flip-flop 53 via the OR circuit 52. In the IO channel 7, the driver 70 generates a normal waveform on the basis of the data inputted to the flip-flop 53 in the IO pin processor 5. In the individual writing mode, waveforms different for each of the DUTs 9 are generated and inputted to the IO pins (DQs) of the corresponding DUTs 9.

On the other hand, pattern data corresponding to the respective driver pins of the respective DUTs 9, which is stored in the AFM 3, is inputted to the driver processor 4 via the AND circuit 56 in the IO pin processor 5 and is further inputted to the sub FC section 48 via the selector 47. The sub FC section 48 creates test data corresponding to individual information of each of the DUTs 9 matched with actual input timing on the basis of the inputted pattern data. This test data is inputted to the flip-flop 43 via the OR circuit 42. In the driver channel 6, the switches 66 and 67 are set to an ON state in order to generate a normal waveform, and a normal waveform is generated on the basis of the data inputted to the flip-flop 43 in the driver pin processor 4. In the individual writing mode, normal waveforms different for each of the DUTs 9 are generated and inputted to the driver pins of the corresponding DUTs 9.

When individual waveform data different for each of the DUTs 9 is inputted to the IO pins or the drive pins, and a corresponding waveform is outputted from the IO pin of the corresponding respective DUTs 9, the comparator 71 of the IO channel 7 compares a voltage of the wave form outputted from this IO pin and a predetermined reference voltage and generates logical data. Moreover, in the IO driver processor 5 corresponding to this IO pin, the logical comparator 59 performs pass/fail judgment using the data inputted from the comparator 71 in the IO channel 7. A result of this judgment is stored in the AFM 3 or the memory 54.

(1-3) Case in Which Individual Information is Written in each of the Plurality of DUTs 9 (No. 2)

When the individual writing mode is designated, and an individual writing mode signal (mode) and a predetermined switching signal (sel) are outputted, in the AND circuits 51 and 41, output data of the TG/main FC units 50 and 40 are masked, and individual writing operations using individual patterns stored in the memories 54 and 44 instead of the output data is started.

In the individual writing operation using the memory 54, pattern data corresponding to the respective IO pins of the respective DUTs 9, which is stored in the memory 54, is read out and inputted to the sub FC section 58 via the selector 57. The sub FC section 58 creates test data corresponding to individual information for each of the DUTs 9 matched with actual input timing on the basis of the inputted pattern data. Then, a normal waveform is generated on the basis of data inputted to the flip-flop 53 via the OR circuit 52. In the IO channel 7, the driver 70 generates a normal waveform on the basis of the data inputted to the flip-flop 53 in the IO pin processor 5. In the individual writing mode, normal waveforms different for each of the DUTs 9 are generated and inputted to the IO pins (DQs) of the corresponding DUTs 9.

On the other hand, in the individual writing operation using the memory 44, pattern data corresponding to the respective driver pins of the respective DUTs 9, which is stored in the memory 44, is readout and inputted to the sub FC section 48 via the selector 47. The sub FC section 48 creates test data corresponding to individual information for each of the DUTs 9 matched with actual input timing on the basis of the inputted pattern data. This test data is inputted to the flip-flop 43 via the OR circuit 42. In the driver channel 6, the switches 66 and 67 are set to an ON state in order to generate a normal waveform, and a normal waveform is generated on the basis of the data inputted to the flip-flop 43 in the driver pin processor 4. In the individual writing mode, normal waveforms different for each of the DUTs 9 are generated and inputted to the driver pins of the corresponding DUTs 9.

Figure 2:
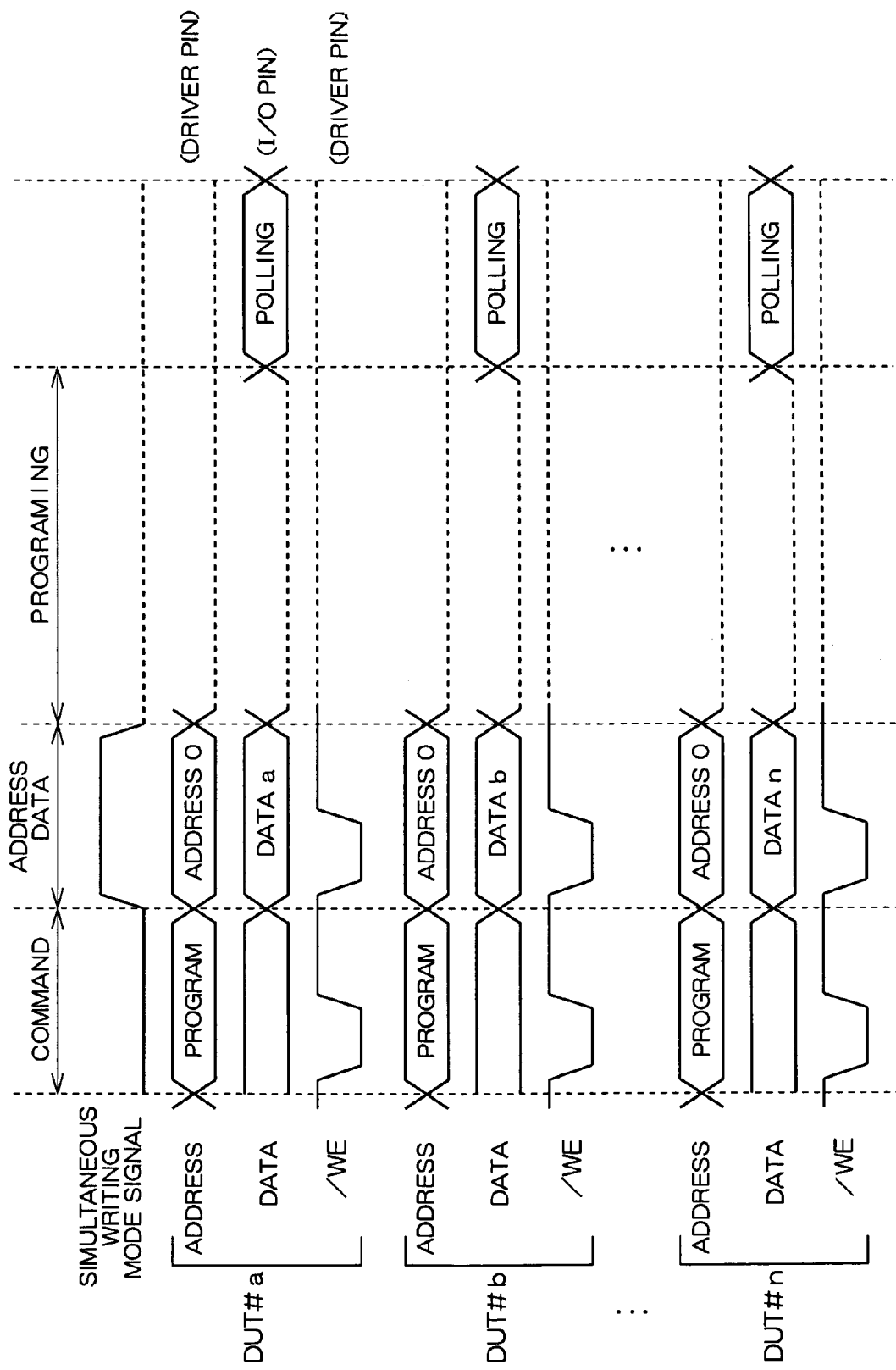
FIG. 2 is a timing chart showing a specific example of a test operation in which an individual writing operation is performed as required.

FIG. 2 is a timing chart showing a specific example of a test operation in which the individual writing operation is performed as required. Timing in the case in which flash memories are tested is shown as an example.

As shown in FIG. 2, in the case in which flash memories are tested, first, common data (program) corresponding to a "command" is inputted to a specific address. This input operation is performed by generating common data with the driver pin processor 4 on the basis of pattern data stored in the ALPG 1.

Next, it is necessary to input data serving as individual information to a specific address 0. As this data, contents different for each of the flash memories are set. For example, data "a", data "b", and data "n" are set in association with a DUT #a, a DUT #b, and a DUT #n, respectively. More specifically, an input operation for the specific address 0 is performed by generating common data with the TG/main FC section 40 in the driver pin processor 4 on the basis of the pattern data stored in the ALPG 1. In addition, an input operation of individual information such as the data "a" is performed by generating individual data with the sub FC section 58 in the IO pin processor 5 on the basis of the individual information stored in the AFM 3 or the memory 54.

When the common command and the individual data are inputted in this way, after programming is executed in each of the DUTs 9 (DUTs #a to #n), a result of the programming is outputted in a form of polling from specific IO pins of the respective DUTs 9. This result of the programming is inputted to the comparator 71 in the IO channel 7, and pass/fail judgment is performed in the logical comparator 59 in the IO pin processor 5.

Figure 3:
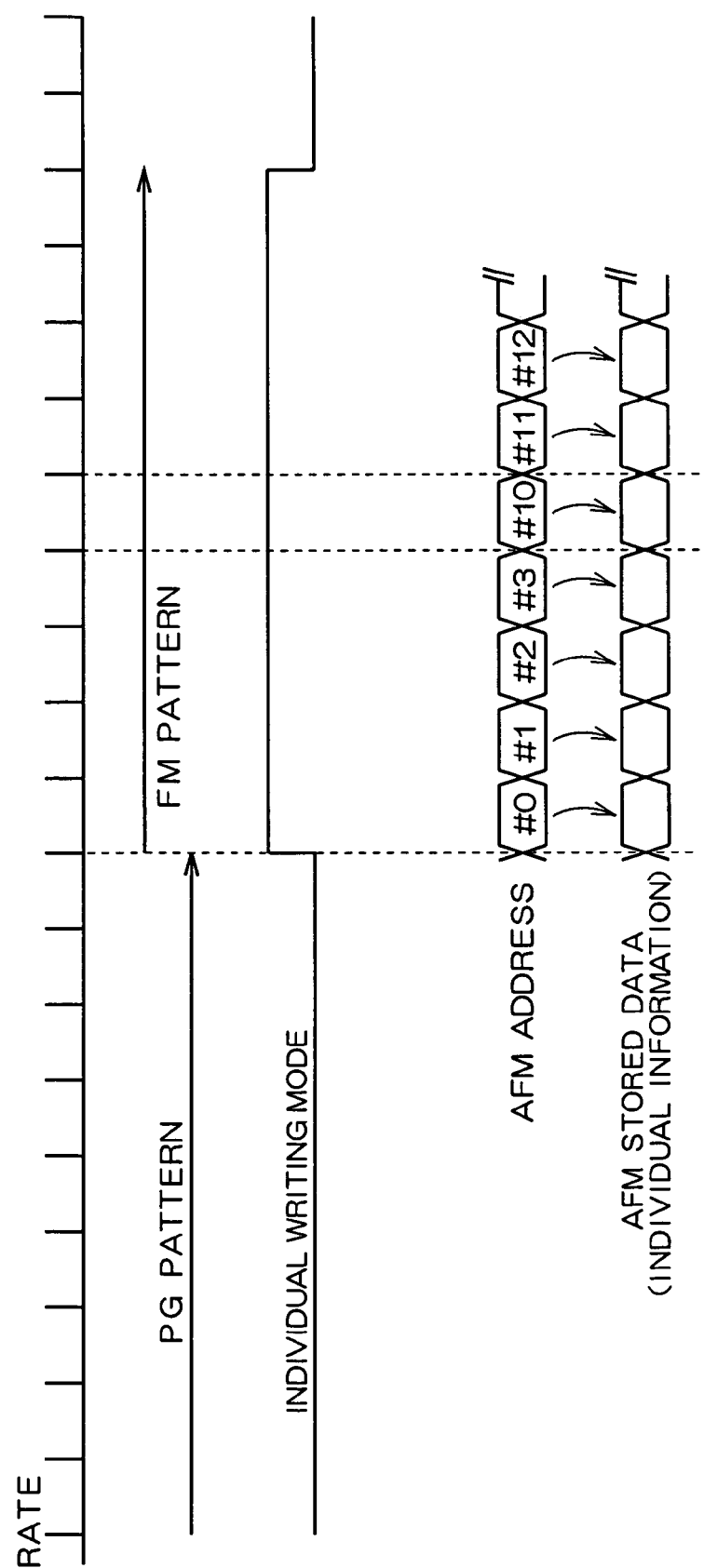
FIG. 3 is a diagram showing timing for changing an individual writing mode.

FIG. 3 is a diagram showing timing for changing the individual writing mode. In FIG. 3, a "PG pattern" and an "FM pattern" indicate pattern data, which is generated using the ALPG 1, and pattern data serving as individual information, which is read out from the AFM 3, respectively. In addition, an "AFM address" is an address, which is specified for reading out pattern data serving as individual information stored in a specific area of the AFM 3, and is designated by, for example, a tester processor. An "AFM stored data" is data stored in the specific area of the AFM 3 designated by the AFM address. An "RATE" is a basic period for performing a test operation.

As shown in FIG. 3, by switching an individual writing mode signal from a low level to a high level during a test, a test operation can be changed from a test operation using the ALPG 1 to a test operation of the individual writing mode using the AFM 3 (or the memories 44 and 54) at any given timing. In addition, thereafter, by returning the individual writing mode signal from the high level to the low level as required, the test operation can be returned to the test operation using the ALPG 1. In particular, in the case in which contents and switching timing of the individual writing mode signal are designated by the pattern data generated by the ALPG 1, a writing mode can be switched to the individual writing mode and, conversely, returned to an original normal mode at necessary timing in a series of test operations, and complicated control of switching timing becomes unnecessary.

(2) Repair Operation

In the repair operation, it is necessary to input a high-voltage waveform to specific driver pins and input data indicating a repair portion to specific IO pins as individual information. In other words, an operation for inputting individual information to the specific IO pins is the same as the operation of the individual writing mode in the above-described test operation. In addition, an operation for inputting the high-voltage waveform to the specific driver pins is also the same as the operation of the individual writing mode in the above-described test operation except that a voltage and a current of the high-voltage waveform are different from a voltage and a current of the normal waveform.

Therefore, settings of the respective sections of the IO pin processor 5 and the driver pin processor 4 at the time of the repair operation are basically the same as these settings at the time of the individual writing mode in the above-described test operation. Individual data indicating a repair portion of the respective DUTs 9 is generated by the IO pin processor 5 and inputted to the IP pins of the respective DUTs 9 from the IO channel 7. In addition, it is necessary to input a high-voltage waveform to a specific driver pin with respect to the DUT 9 to be repaired. Individual information, which indicates whether or not the DUT 9 is to be repaired is generated by the driver pin processor 4 corresponding to this driver pin and inputted to the driver channel 6. In the driver channel 6, the switches 65 and 68 are set to an ON state in order to generate a high-voltage waveform, and a high-voltage waveform is generated on the basis of data outputted from the driver pin processor 4. This high-voltage waveform is inputted to a specific driver pin for which the repair operation is performed.

FIG. 4 is a timing chart showing a specific example of the repair operation. In FIG. 4, "DQ1 to DQ9" and "DR1" indicate a plurality of IO pins, which are necessary for specifying a repair line in the repair operation, and a driver pin, to which a high-voltage waveform is to be inputted, respectively. In addition, an "HC cycle" indicates timing for actually inputting the high-voltage waveform in the driver pin.

As shown in FIG. 4, in the case in which the DUTs 9 including a defective cell is repaired, first, individual normal waves are inputted to the respective specific IO pins (DQ1 to DQ9) of the plurality of DUTs 9. This input operation of the normal waveforms is performed on the basis of individual information stored in the AMF 3 or the memory 54. Next, in an HC cycle, high-voltage waveforms are inputted to respective specific driver pins (DR1) of the plurality of DUTs 9.

In this way, in the semiconductor test apparatus of this embodiment, operations for generating and inputting plural pieces of individual information different from each other can be performed in parallel with respect to each of the plurality of DUTs 9. Thus, time required for a test in the case in which input of different kinds of individual information is necessary can be reduced.

In addition, by setting types of waveforms selectable in the sub FC units 48 and 58 to be fewer than types of waveforms selectable in the TG/main FC units 40 and 50, an increase in a size of the apparatus can be controlled to minimum.

In addition, by storing individual information in the AFM 3, wirings for high-speed data signals and the like used for connecting the AFM 3 and the IO pin processor 5 can be used for reading out the individual information. Thus, substantial simplification of wiring becomes possible.

Further, since the memories 54 and 44 for storing individual information are provided in the IO pin processor 5 and the driver pin processor 4, wiring drawing around in the outside of a package of an ASIC becomes unnecessary, and simplification of wiring becomes possible. In addition, since unnecessary wiring is eliminated, timing delay is less likely to occur, and reading-out of the individual information can be performed at high speed.

Moreover, a normal waveform and a high-voltage waveform to be inputted to the DUTs 9 can be switched by providing the driver channel 6, it becomes possible to electrically cut a fuse provided in the DUTs 9. Therefore, time and labor for performing a repair operation for transferring to a separate repair apparatus can be reduced, and reduction in time of the entire repair operation becomes possible.

Note that the present invention is not limited to the above-described embodiments, and various modifications are possible within the scope of the gist of the present invention. For example, although the description is made assuming that the DUTs 9 are mainly semiconductor memories in the above-described embodiment, the present invention can be applied to logic ICs if a plurality of logic ICs are tested simultaneously.

In addition, in the above-described embodiments, separately from the TG/main FC units 40 and 50, the sub FC units 48 and 58 with a part of functions of the TG/main FC units 40 and 50 omitted are provided. However, in the case in which an increase in a size of the apparatus is permitted, instead of the sub FC units 48 and 58, TG/main FC units may be provided in the same number as the sub FC units 48 and 58. In this case, the TG/main FC units 40 and 50 and the AND circuits 41 and 51 included in FIG. 1 are removed, and third input terminals are added to the selectors 47 and 57 to input pattern data, which is inputted from the ALPG 1, to the respective TG/main FC units provided anew via the selectors 47 and 57.

INDUSTRIAL APPLICABILITY

As described above, according to the present invention, since operations for generating plural pieces of individual information different from each other and inputting the individual information to each of a plurality of semiconductor devices can be performed in parallel, time required for a test in the case in which input of different kinds of individual information is required can be reduced.

The invention claimed is:

1. A semiconductor testing apparatus, characterized by comprising:
    a first waveform generation unit which generates a common pattern waveform corresponding to common information which is common to each of a plurality of semiconductor devices;
    a plurality of second waveform generation units which generate individual pattern waveforms corresponding to plural pieces of individual information which are prepared individually in association with each of said plurality of semiconductor devices; and
    a waveform switching unit which commonly inputs the common pattern generated by said first waveform generation unit and which individually inputs the individual pattern waveforms generated by each of said plurality of second waveform generation units to each of said plurality of semiconductor devices.

2. The semiconductor testing apparatus according to claim 1, characterized by further comprising:
    a pass/fail judgment unit which performs pass/fail judgment of a test object portion in said semiconductor devices on the basis of an output waveform which is outputted from said semiconductor devices in association with the common pattern waveform or the individual pattern waveforms; and a fail memory which stores a result of the judgment by said pass/fail judgment unit.

3. The semiconductor testing apparatus according to claim 2, characterized in that said fail memory has a first storage area for storing a result of the judgment by said pass/fail judgment unit and a second storage area for storing the individual information, and said second waveform generation unit reads out the individual information stored in said second storage area to generate the individual pattern waveforms.

4. The semiconductor testing apparatus according to claim 1, characterized by further comprising a memory, which is provided in a same package as the second waveform generation unit and stores the individual information, and in that said second waveform generation unit reads out the individual information stored in said memory to generate the individual pattern waveforms.

5. A semiconductor testing apparatus, characterized by comprising:

a first waveform generation unit which generates a common pattern waveform corresponding to common information which is common to each of a plurality of semiconductor devices;

a plurality of second waveform generation units which generate individual pattern waveforms corresponding to plural pieces of individual information which are prepared individually in association with each of said plurality of semiconductor devices; and a waveform switching unit which commonly inputs the common pattern generated by said first waveform generation unit and which individually inputs the individual pattern waveforms generated by each of said plurality of second waveform generation units to each of said plurality of semiconductor devices.

* * * * *